US011292066B2

(12) United States Patent
Hanyu et al.

(10) Patent No.: US 11,292,066 B2
(45) Date of Patent: Apr. 5, 2022

(54) TOOL HAVING A BORON DOPED DIAMOND COATING

(71) Applicant: OSG CORPORATION, Toyokawa (JP)

(72) Inventors: Hiroyuki Hanyu, Toyokawa (JP); Yasuo Fukui, Toyokawa (JP)

(73) Assignee: OSG CORPORATION, Toyokawa (JP)

( * ) Notice: Subject to any disclaimer, the term of this patent is extended or adjusted under 35 U.S.C. 154(b) by 79 days.

(21) Appl. No.: 16/468,795

(22) PCT Filed: Jan. 16, 2017

(86) PCT No.: PCT/JP2017/001275
§ 371 (c)(1),
(2) Date: Jun. 12, 2019

(87) PCT Pub. No.: WO2018/131166
PCT Pub. Date: Jul. 19, 2018

(65) Prior Publication Data
US 2020/0094330 A1 Mar. 26, 2020

(51) Int. Cl.
*B23B 51/00* (2006.01)
*B22F 7/06* (2006.01)
*C23C 16/27* (2006.01)

(52) U.S. Cl.
CPC ............... *B23B 51/00* (2013.01); *B22F 7/06* (2013.01); *B23B 2226/31* (2013.01); *C23C 16/27* (2013.01)

(58) Field of Classification Search
CPC .... B22F 2999/00; B22F 2999/10; B22F 7/06; B22F 2005/001; B22F 2998/00;
(Continued)

(56) References Cited

U.S. PATENT DOCUMENTS 5,075,181 A * 12/1991 Quinto .................... B32B 18/00
428/698
2006/0115650 A1 * 6/2006 Hanyu .................... C04B 41/89
428/408
(Continued)

FOREIGN PATENT DOCUMENTS

CN      1620349 A     5/2005
CN      1942274 A     4/2007
(Continued)

OTHER PUBLICATIONS

Haniyu, Hiroyuki, translation for JP-2006152423-A, Jun. 2006 (Year: 2020).*
(Continued)

*Primary Examiner* — Pegah Parvini
*Assistant Examiner* — Ross J Christie
(74) *Attorney, Agent, or Firm* — WHDA, LLP

(57) ABSTRACT

To provide a tool that ensures improved durability even when a diamond coating containing boron is formed. A diamond coating (40) includes a first layer (41) that is formed as a layer on a surface layer side of the diamond coating (40) and is regarded as containing no boron, and a second layer (42) positioned on a side of a base material (30) with respect to the first layer (41) and contains at least 1000 ppm or more of the boron. Since the first layer (41) with a larger compressive stress is formed on the surface layer of the diamond coating (40), a crack generation from the surface layer side of the diamond coating (40) during the process can be reduced. Consequently, the durability of a tool (1) can be improved even when the diamond coating (40) containing 1,000 ppm or more of boron is formed.

5 Claims, 4 Drawing Sheets

(58) Field of Classification Search
CPC .... B22F 7/062; B22F 1/025; B22F 2003/244; B22F 2207/03; B22F 3/26; B22F 3/14; B22F 3/24; B22F 2007/066; B22F 7/08; B22F 2201/02; B22F 2201/04; B22F 2201/10; B22F 2201/20; B22F 2202/11; B22F 3/02; B22F 3/04; B22F 3/10; B22F 3/1039; B22F 3/164; B22F 3/17; B22F 1/00; B22F 2003/241; B22F 3/12; B22F 5/00; B22F 7/04; B23B 2228/10; B23B 2228/08; B23B 27/141; B23B 27/148; B23B 2226/125; B23B 2226/315; B23B 2228/04; B23B 2228/105; B23B 2200/00; B23B 2200/08; B23B 2200/081; B23B 2200/087; B23B 2200/12; B23B 2200/204; B23B 2200/205; B23B 2200/242; B23B 2222/04; B23B 2222/16; B23B 2224/24; B23B 2224/28; B23B 2224/36; B23B 2226/12; B23B 2226/31; B23B 51/08

See application file for complete search history.

(56) References Cited

U.S. PATENT DOCUMENTS

| | | | | |
|---|---|---|---|---|
| 2008/0240876 | A1* | 10/2008 | Elkouby | C23C 30/005 407/119 |
| 2010/0062257 | A1* | 3/2010 | Morstein | C23C 14/325 428/408 |
| 2018/0347034 | A1* | 12/2018 | Bolz | C23C 14/022 |

FOREIGN PATENT DOCUMENTS

| | | |
|---|---|---|
| CN | 101090790 A | 12/2007 |
| CN | 102091923 A | 6/2011 |
| CN | 103506640 A | 1/2014 |
| CN | 105965043 A | 9/2016 |
| EP | 2 772 330 A1 | 9/2014 |
| JP | 6-285704 A | 10/1994 |
| JP | 2006-152423 A | 6/2006 |
| JP | 2006-152424 A | 6/2006 |
| JP | 2006152423 A * | 6/2006 |
| JP | 2008-229781 A | 10/2008 |
| KR | 10-2015-0133816 A | 11/2015 |
| WO | 2016102170 A1 | 6/2016 |

OTHER PUBLICATIONS

Office Action dated Jun. 9, 2020, issued in Counterpart JP Application No. 2018-561777, with English Translation. (13 pages).

Office Action dated Feb. 25, 2020, issued in counterpart CN Application No. 201780077661.6, with English translation (13 pages).

International Search Report dated Apr. 4, 2017, issued in counterpart application No. PCT/JP2017/001275, w/English translation (4pages).

Written Opinion dated Apr. 4, 2017, issued in counterpart application No. PCT/JP2017/001275 (4pages).

Notification of Transmittal of Translation of the International Preliminary Report on Patentability (Form PCT/IB/326) issued in counterpart International application No. PCT/JP2017/001275 dated Jul. 25, 2019 with Forms PCT/IB/338, PCT/IB/373 and PCT/ISA/237, with English translation. (13 pages).

Extended Search Report dated May 4, 2020, issued in counterpart EP Application No. 17891586.4 (9 pages).

Lei, Xuelin et al., "Effect of Boron-Doped Diamond Interlayer on Cutting Performance of Diamond Coated Micro Drills for Graphite Machining", materials, vol. 6, No. 8, Jul. 25, 2013, pp. 3128-3138; Cited in EESR Mary 4, 2020.

* cited by examiner

| | oxidation resistance | | friction coefficient | cutting durability | adhesion |
|---|---|---|---|---|---|
| | 600°C | 700°C | | | |
| conventional product A | 0.3% | 11.8% | 0.22 | 2.5m | 1 second |
| conventional product B | 5.4% | 48.0% | 0.33 | 4.5m | 1 second |
| present invention A | 3.8% | 23.0% | 0.32 | 12.5m | 15 seconds |
| present invention B | 0.4% | 12.5% | 0.23 | 42m or more | 85 seconds |
| present invention C | 0.4% | 12.0% | 0.25 | 42m or more | 178 seconds |
| present invention D | 0.4% | 8.0% | 0.23 | 42m or more | 325 seconds |

Fig. 4

TOOL HAVING A BORON DOPED DIAMOND COATING

TECHNICAL FIELD

The present invention relates to a tool, in particular, relates to a tool that ensures improved durability even when a diamond coating containing boron is formed.

BACKGROUND ART

There is known a technique to improve oxidation resistance and lubricity of a diamond coating by doping boron into the diamond coating formed on a surface of a base material of a tool. For example, Patent Literature 1 discloses a diamond coated tool having a base material surface on which a diamond coating is formed. The diamond coating includes a low doping layer where a doping amount of the boron is small and a high doping layer where a doping amount of the boron is large. This diamond coated tool ensures improved oxidation resistance and lubricity of the tool since the high doping layer with the large doping amount of the boron is formed on the surface layer.

CITATION LIST

Patent Literature

Patent Literature 1: Japanese Unexamined Patent Application Publication No. 2006-152423 (for example, paragraph 0029, FIG. 11)

SUMMARY OF INVENTION

Technical Problem

However, with the above-described conventional technique, the high doping layer with the large doping amount of the boron is formed on the surface layer of the diamond coating. Therefore, a residual stress of compression in the surface layer reduces to easily generate a crack from a side of the surface layer when a workpiece is processed. Accordingly, there has been a problem of decreased durability of a tool.

The present invention has been made to solve the above-described problem, and its object is to provide a tool that ensures improved durability even when a diamond coating containing boron is formed.

Solution to Problem

In order to achieve this purpose, in a tool of the present invention, a diamond coating includes: a first layer that is formed as a layer on a side of a surface layer of the diamond coating and contains less than 1000 ppm of the boron or is regarded as containing no boron, and a second layer formed as a layer positioned on a side of the base material with respect to the first layer of the diamond coating and contains at least 1000 ppm or more of the boron.

Advantageous Effects of Invention

With a tool according to a first aspect, the diamond coating includes the first layer formed as the layer on the surface layer side of the diamond coating and contains less than 1000 ppm of the boron or is regarded as containing no boron, and the second layer formed as the layer positioned at the base material side with respect to the first layer of the diamond coating and contains at least 1000 ppm or more of the boron. The first layer has a contained amount of the boron of less than 1000 ppm or is regarded as containing no boron, and thus, the first layer has a residual stress of compression larger than that of the second layer that contains 1000 ppm or more of the boron.

That is, since the first layer with a large residual stress of compression is formed on the surface layer of the diamond coating, a crack generation from the surface layer side of the diamond coating when a workpiece is processed can be reduced. Accordingly, even when the diamond coating containing 1000 ppm or more of the boron is formed, there is an effect that durability of the tool can be improved.

Furthermore, the second layer formed on the base material side of the first layer ensures reducing the excessive residual stress of compression of the first layer by the second layer and improving oxidation resistance and lubricity of the diamond coating by the boron contained in the second layer. Accordingly, there is an effect of improving the durability of the tool.

With the tool according to a second aspect, in addition to the effect provided by the tool according to the first aspect, a plurality of the second layers are laminated, and the second layer positioned on the surface layer side has a contained amount of the boron set to more than a contained amount of the boron of the second layer positioned on the base material side. Therefore, the oxidation resistance and the lubricity of the surface layer side of the diamond coating can be improved and the residual stress of compression on the base material side of the diamond coating can be increased. This ensures improved wear resistance of the surface layer side of the diamond coating and improved adhesion of the diamond coating to the base material by reducing the crack generation from the base material. Accordingly, there is an effect of improving the durability of the tool.

With the tool according to a third aspect, in addition to the effect provided by the tool according to the first aspect or second aspect, the first layer has a film thickness set to a dimension having 10% or more and 50% or less with respect to a dimension of a film thickness of the diamond coating. Therefore, excessive increase or decrease of the residual stress of compression in the surface layer of the diamond coating can be reduced. Accordingly, buckling of the surface layer of the diamond coating and the crack generation from the surface layer side can be reduced, and thus, there is an effect of improving the durability of the tool.

With the tool according to a fourth aspect, in addition to the effect provided by the tool according to the first aspect, the first layer is regarded as containing no boron. Therefore, the crack generation from the surface layer side of the diamond coating can be reduced with more certainty. Accordingly, there is an effect of improving the durability of the tool.

With the tool according to a fifth aspect, in addition to the effect provided by the tool according to the fourth aspect, the plurality of diamond coatings are laminated. Thus, the first layer with a large residual stress of compression is laminated between respective layers of the second layers with a small residual stress of compression. This ensures enhancing toughness of the whole plurality of diamond coatings, and even when a crack is generated in the second layer, ensures reducing an extension of the crack by the residual stress of compression of the first layer. Accordingly, there is an effect of improving the durability of the tool.

With the tool according to a sixth aspect, in addition to the effect provided by the tool according to the fifth aspect, the second layer of the diamond coating positioned on the surface layer side has a contained amount of the boron set to more than a contained amount of the boron of the second layer of the diamond coating positioned on the base material side. Therefore, the oxidation resistance and the lubricity in the surface layer side can be improved and the crack generation from the base material side can be reduced by enhancing the residual stress of compression on the base material side. While in this case, causing the second layer of the diamond coating positioned closest to the surface layer side to contain more boron decreases the residual stress of compression, the first layers are laminated on and under the second layer, thereby ensuring the reduced crack generation from the surface layer side. Accordingly, there is an effect of improving the durability of the tool.

With the tool according to a seventh aspect. in addition to the effect provided by the tool according to the sixth aspect, the first layer and the second layer of the plurality of diamond coatings are formed to have a configuration where film thicknesses of the first layer and the second layer gradually decrease toward the surface layer side from the base material side. Therefore, an increased count of layers of the first layer and the second layer per unit volume in the surface layer side ensures improved toughness. Furthermore, the second layer on the base material side has a small contained amount of the boron compared with that of the surface layer side. Therefore, a decreased count of layers of the first layer and the second layer per unit volume in the base material side ensures the increased residual stress of compression in the base material side. This ensures the improved toughness of the diamond coating on the surface layer side and the improved adhesion of the diamond coating to the base material by reducing the crack generation from the base material side. Accordingly, there is an effect of improving the durability of the tool.

With the tool according to an eighth aspect. in addition to the effect provided by the tool according to any one of the fifth to seventh aspects. the diamond coating positioned closest to the base material side among the plurality of diamond coatings is formed as a layer between the base material and the second layer, and includes a third layer regarded as containing no boron. Therefore, the third layer regarded as containing no boron is formed between the diamond coating (diamond coating positioned closest to base material) and the base material. This ensures an increased compressive stress in the base material side of such diamond coating, thereby ensuring the reduced crack generation from the base material side. Accordingly, the adhesion of the diamond coating to the base material can be improved, and thus, there is an effect of improving the durability of the tool.

With the tool according to a ninth aspect, in addition to the effect provided by the tool according to any one of the fifth to eighth aspects, the first layer has a film thickness set to a dimension having less than 100% with respect to a dimension of a film thickness of the second layer. Therefore, the excessive increase of the residual stress of compression of the first layer can be reduced. Accordingly, buckling of the diamond coating When a workpiece is processed can be reduced, and thus, there is an effect of improving the durability of the tool.

With the tool according to a tenth aspect, in addition to the effect provided by the tool according to the ninth aspect, the first layer has the film thickness set to a dimension having 25% or more with respect to the film thickness of the second layer. Therefore, the decreased residual stress of compression of the first layer can be reduced. Accordingly, the toughness of the whole plurality of diamond coatings can be improved while reducing the crack generation from the first layer of the diamond coating positioned closest to the surface layer side, and thus, there is an Effect of improving the durability of the tool.

BRIEF DESCRIPTION OF DRAWINGS

FIG. 4 is a table that shows test results of verification tests.

DESCRIPTION OF EMBODIMENTS

Figure 1:
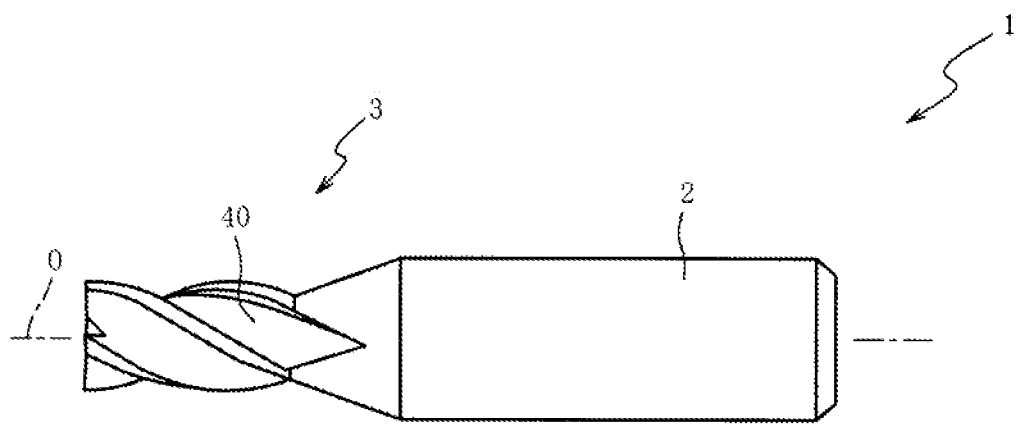
FIG. 1(a) is a side view of a tool.
FIG. 1(b) is a partially enlarged cross-sectional view of the tool, according to a first embodiment of the present invention.
Figure 1:
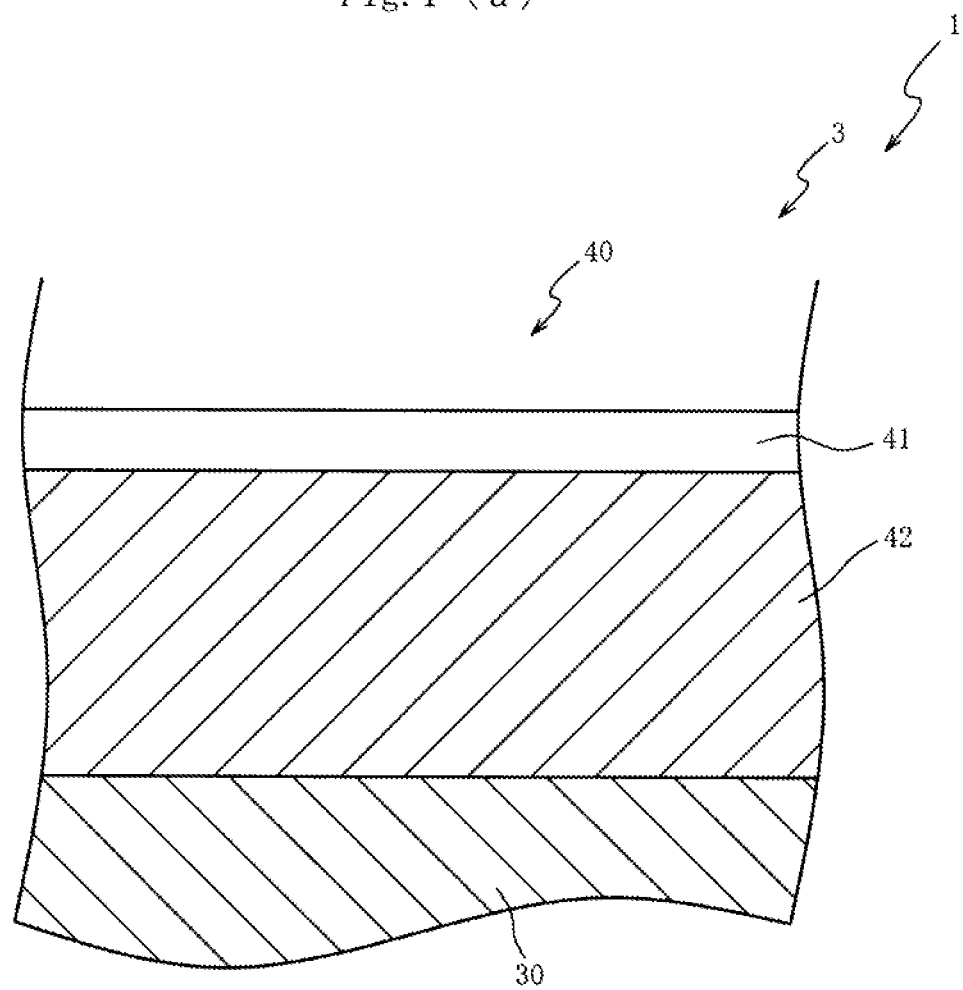

The following describes preferred embodiments of the present invention with reference to attached drawings. First, with reference to FIGS. 1, a description will be given of a configuration of a tool 1 according to a first embodiment. FIG. 1(a) is a side view of the tool 1 according to the first embodiment of the present invention. FIG. 1(b) is a partially enlarged cross-sectional view of the tool 1. FIG. 1(b) illustrates a cross-sectional surface taken along a planar surface including an axial center O of the tool 1, and omits hatching of a first layer 41.

As illustrated in FIGS. 1, the tool 1 (end mill in the embodiment) is a tool to perform a cutting work of a workpiece by a rotational force transmitted from a processing machine (for example, machining center) via a holder (not illustrated). The tool 1 includes a main body 2 that rotates about the axial center O and a cutting part 3 arranged on a distal end side (left side in FIG. 1(a)) of the main body 2.

The main body 2 is made out of cemented carbide into a columnar shape. The rotational force transmitted from the processing machine via this main body 2 rotates the cutting part 3 to perform the cutting work.

The cutting part 3 includes a base material 30 and a diamond coating 40. The base material 30 is made of the cemented carbide. The diamond coating 40 is formed on a surface layer of the base material 30 and formed as a coating of a diamond that at least partly contains boron.

The diamond coating 40 includes the first layer 41 and a second layer 42. The first layer 41 forms a surface layer of the diamond coating 40 and contains less than 1000 ppm of the boron. The second layer 42 is laminated with the first layer 41 and contains 1000 ppm or more and less than 50000 ppm (10000 ppm in the embodiment) of the boron.

A film formation of this diamond coating 40 containing the boron (that is, boron doped diamond coating) is performed by a CVD method. In the embodiment, a microwave plasma CVD method is used, but another CVD method (for example, hot filament CVD method and plasma CVD method) may be used. Accordingly, a known method can be employed for the film forming method of the diamond coating 40 (laminating method for first layer 41 and second layer 42), and therefore, its detailed description is omitted.

While the first layer 41 is formed as a coating of a diamond containing less than 1000 ppm of the boron, substantially, it is formed as a layer not containing the boron. That is, for example, in the case where, after the second layer 42 containing 10000 ppm of the boron is formed by a microwave plasma CVD method device (not illustrated), the first layer 41 regarded as containing no boron is formed with the identical device, the boron (contamination) remained in the device may cause less than 1000 ppm of the boron to be mixed into the first layer 41. Accordingly, (for example, less than 1000 ppm of) the boron contained as such an impurity is substantially defined as containing no boron.

The first layer 41 has a film thickness set to 0.5 μm to 3 μm (3 μm in the embodiment) and the second layer 42 has a film thickness set to 2 μm to 40 μm (15 μm in the embodiment). The diamond coating 40 has a whole film thickness set to 2.5 μm to 43 μm (18 μm in the embodiment).

Here, the second layer 42 containing 10000 ppm of the boron has a residual stress of compression (compressive stress remained in coating formed by CVD method. Hereinafter simply referred to as "compressive stress") reduced with respect to that of the first layer 41 containing less than 1000 ppm of the boron (regarded as containing no boron). Accordingly, for example, if the second layer 42 is formed on the surface layer side of the diamond coating 40, a crack is easily generated from the surface layer side due to a load added to the diamond coating 40 and a thermal expansion of the diamond coating 40 when the workpiece is processed (hereinafter simply referred to as "at processing").

In contrast to this, with the tool 1 according to the embodiment, the first layer 41, which contains less than 1000 ppm of the boron (which is regarded as containing no boron), is laminated on the second layer 42, which contains 10000 ppm of the boron, thereby ensuring an increased compressive stress in the surface layer of the diamond coating 40. This ensures a reduced crack generation from the surface layer side of the diamond coating 40 at processing. Furthermore, the second layer 42 formed on a side of the base material 30 of the first layer 41 ensures reducing the excessive compressive stress of the first layer 41 by the second layer 42 and improving oxidation resistance and lubricity of the diamond coating 40 by the boron contained in the second layer 42. That is, the first layer 41 can improve wear resistance while the second layer 42 ensuring the oxidation resistance and the lubricity of the diamond coating 40, thereby ensuring improved durability of the tool 1.

In this case, the film thickness of the first layer 41 is preferred to be set to a dimension having 10% or more and 50% or less with respect to the film thickness of the diamond coating 40. When the film thickness of the first layer 41 is set to a dimension having less than 10% with respect to the film thickness of the diamond coating 40, the compressive stress in the surface layer of the diamond coating 40 decreases to easily generate the crack from the surface layer side at processing. When the film thickness of the first layer 41 is set to a dimension having more than 50% with respect to the film thickness of the diamond coating 40, the compressive stress in the surface layer of the diamond coating 40 excessively increases to easily buckle the surface layer of the diamond coating 40 at processing.

Accordingly, setting the film thickness of the first layer 41 to the dimension having 10% or more and 50% or less with respect to the film thickness of the diamond coating 40 ensures reducing the buckling of the surface layer of the diamond coating 40 while reducing the crack generation from the surface layer side of the diamond coating 40 at processing.

Next, with reference to FIG. 2(*a*), a second embodiment will be described. In the first embodiment, the case where one layer of the second layer 42 is formed and this second layer 42 contains 10000 ppm of the boron has been described. In the second embodiment, a description will be given of a case where a plurality of second layers 242 are formed and contained amounts of boron in the plurality of those second layers 242 gradually increase toward the surface layer side of a diamond coating 240 from the base material 30 side. Parts identical to those of the above-described first embodiment are attached by identical reference numerals to omit their explanations.

Figure 2:
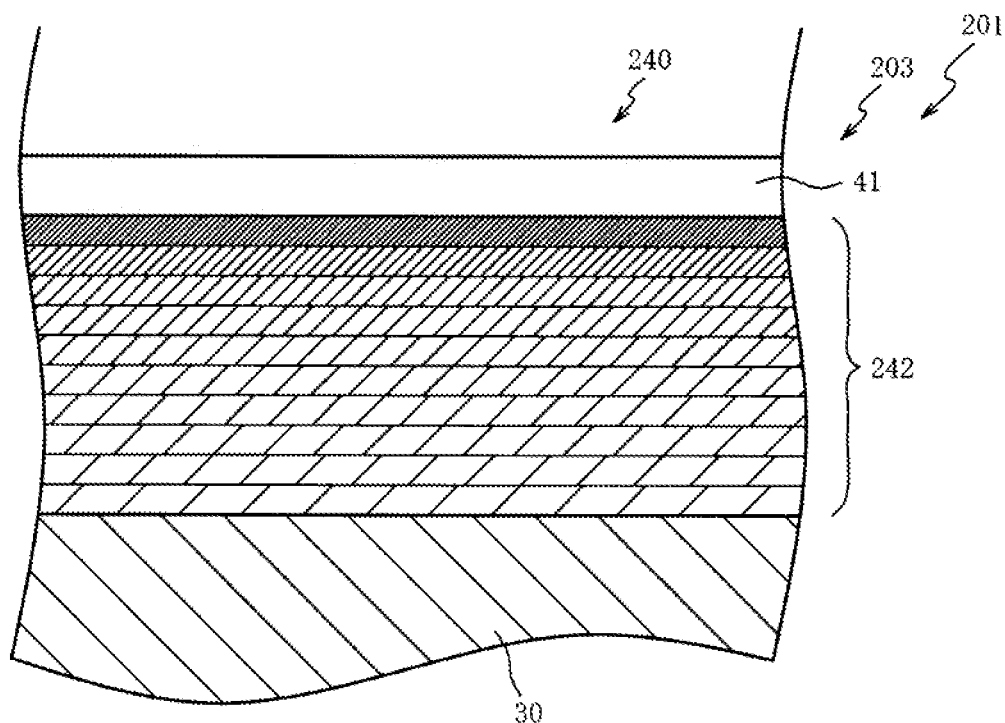
FIG. 2(a) is a partially enlarged cross-sectional view of a tool according to a second embodiment.
FIG. 2(b) is a partially enlarged cross-sectional view of a tool according to a third embodiment.
Figure 2:
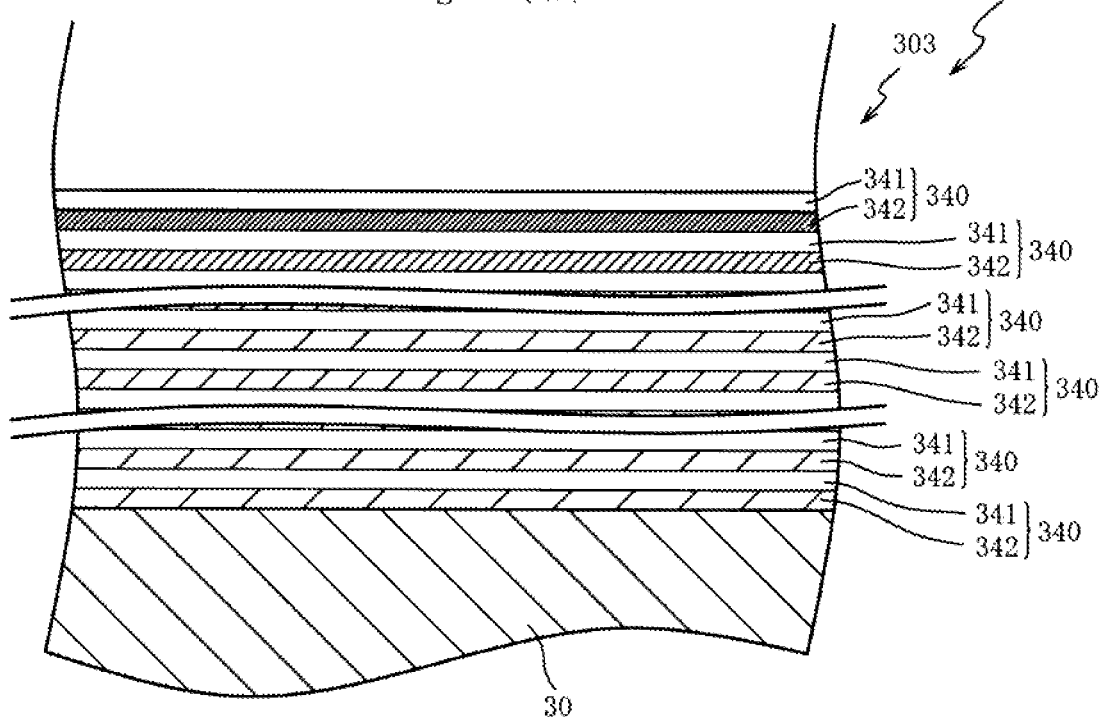

FIG. 2(*a*) is a partially enlarged cross-sectional view of a tool 201 according to the second embodiment. In FIG. 2(*a*), the contained amounts of boron contained in the second layers 242 are illustrated by shading of hatchings. The same applies to FIG. 2(*b*) and thereafter. While the plurality of second layers 242 have respectively different contained amounts of boron, a description is made by attaching an identical reference numeral in order to simplify the drawing.

As illustrated in FIG. 2(*a*), the plurality (ten layers in the embodiment) of second layers 242 are formed. The second layer 242 positioned closest to the base material 30 side (lower side in FIG. 2(*a*)) among the plurality of those second layers 242 has a contained amount of boron set to 1000 ppm to 10000 ppm (1000 ppm in the embodiment). The second layer 242 positioned closest to the surface layer side (upper side in FIG. 2(*a*)) of the diamond coating 240 has a contained amount of boron set to 10000 to 50000 ppm (10000 ppm in the embodiment). The respective film thicknesses of the plurality of second layers 242 are set to constant (1.5 μm in the embodiment).

The contained amounts of boron in the plurality of those second layers 242 are set so as to gradually increase toward the surface layer side of the diamond coating 240 from the base material 30 side (that is, the second layer 242 positioned on the surface layer side has contained amount of boron more than the second layer 242 positioned on the base material 30 side has). This ensures an increased compressive stress of the second layer 242 in the base material 30 side while improving oxidation resistance and lubricity of the second layer 242 in the surface layer side of the diamond coating 240. That is, wear resistance in the surface layer side (side to be processed) of the diamond coating 240 can be improved and adhesion of the diamond coating 240 to the base material 30 can be improved by reducing the crack generation from the base material 30 side. Accordingly, durability of the tool 201 improves.

Next, with reference to FIG. 2(*b*), a third embodiment will be described. In the first embodiment, the case where one layer of the diamond coating 40 is formed has been described. In the third embodiment, a description will be given of a case where a plurality of diamond coatings 340 are laminated. Parts identical to those of the above-described first embodiment are attached by identical reference numerals to omit their explanations.

FIG. 2(*b*) is a partially enlarged cross-sectional view of a tool 301 according to the third embodiment. While the plurality of diamond coatings 340 have second layers 342 that have respectively different contained amounts of boron, a description is made by attaching an identical reference numeral in order to simplify the drawing.

As illustrated in FIG. 2(*b*), the plurality (twelve layers in the embodiment) of diamond coatings 340 are each laminated with a constant film thickness (in the embodiment, a first layer 341 and the second layer 342 have film thicknesses each set to 0.8 µm, and the plurality of diamond coatings 340 have film thicknesses each set to 1.6 µm).

This laminates each of the first layers 341 with a large residual stress of compression between the respective layers of the second layers 342 with a small residual stress of compression, thereby ensuring enhanced toughness of the whole plurality of diamond coatings 340. Furthermore, even when a crack is generated in the second layer 342 at processing, the compressive stress of the first layer 341 can reduce an extension of the crack.

In the embodiment, similar to the second embodiment, the second layer 342 positioned closest to the base material 30 has a contained amount of boron set to 1000 ppm to 10000 ppm (1000 ppm in the embodiment), and the second layer 342 positioned closest to the surface layer has a contained amount of boron set to 10000 to 50000 ppm (10000 ppm in the embodiment). The contained amounts of boron contained in the plurality of those second layers 342 are set so as to increase gradually toward the surface layer side from the base material 30 side (that is, the second layer 342 of the diamond coating 340 positioned on the surface layer side has a contained amount of boron more than the second layer 342 of the diamond coating 340 positioned on the base material 30 side has).

This ensures improved oxidation resistance and lubricity of the diamond coatings 340 positioned on the surface layer side. Furthermore, a compressive stress of the diamond coatings 340 positioned on the base material 30 side can be increased, thereby reducing the crack generation from the base material 30 side to ensure improved adhesion of the diamond coatings 340 to the base material 30.

Here, in the case where the second layer 342 of the diamond coating 340 positioned on the surface layer side is caused to contain increased boron, the compressive stress decreases by the amount of boron, and thus, a crack is easily generated at processing. In contrast to this, with the tool 301 according to the embodiment, since the first layers 341 are laminated on and under the second layer 342, even when a crack is generated in the second layer 342 at processing, the compressive stress of the first layer 341 can reduce an extension of the crack. Accordingly, the crack generation from the surface layer side can be reduced with more certainty while improving the oxidation resistance and the lubricity of the surface layer side, thereby improving durability of the tool 301.

Next, with reference to FIG. 3(*a*), a fourth embodiment will be described. In the third embodiment, the case where the plurality of diamond coatings 340 have respective film thicknesses set to constant has been described. In the fourth embodiment, a description will be given of a case where a plurality of diamond coatings 440 have film thicknesses set so as to get thinner gradually toward the surface layer side from the base material 30 side. Parts identical to those of the above-described third embodiment are attached by identical reference numerals to omit their explanations.

Figure 3:
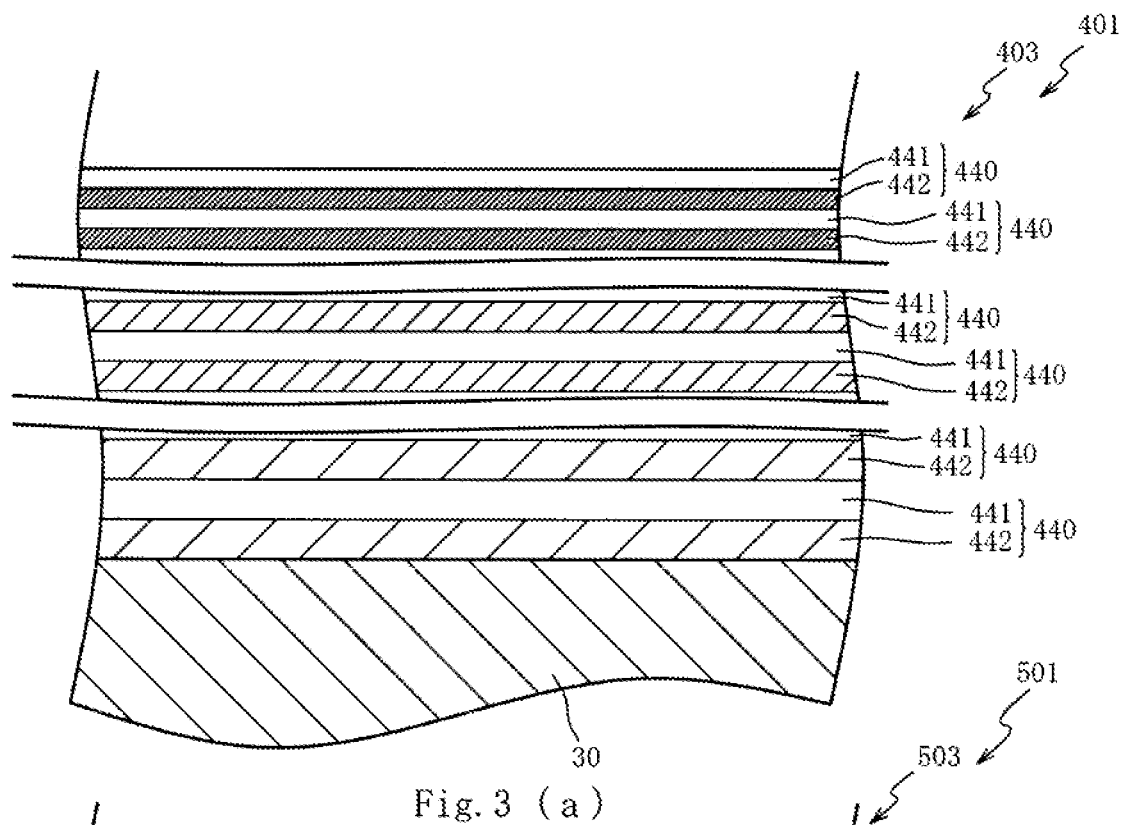
FIG. 3(a) is a partially enlarged cross-sectional view of a tool according to a fourth embodiment.
FIG. 3(b) is a partially enlarged cross-sectional view of a tool according to a fifth embodiment.
Figure 3:
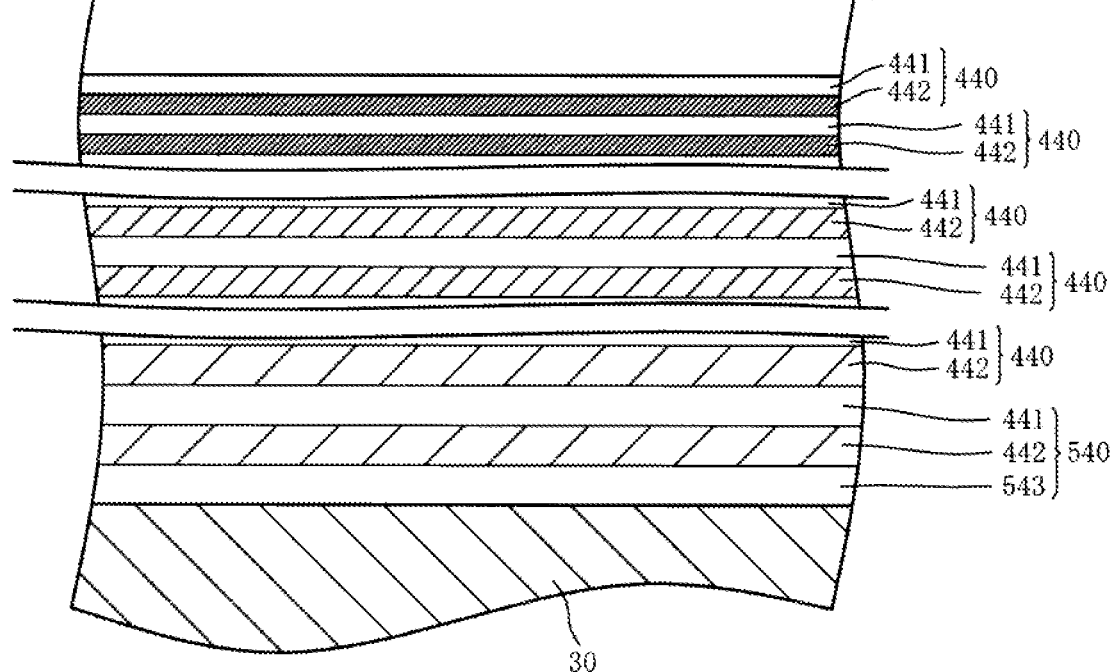

FIG. 3(*a*) is a partially enlarged cross-sectional view of a tool 401 according to a fourth embodiment. Although the plurality of diamond coatings 440 have first layers 441 and second layers 442 that have respectively different film thicknesses and contained amounts of boron, the description will be given by attaching an identical reference numeral in order to simplify the drawing.

As illustrated in FIG. 3(*a*), the plurality (fifteen layers in the embodiment) of diamond coatings 440 are laminated. The second layer 442 positioned closest to the base material 30 side among the plurality of these diamond coatings 440 has a contained amount of boron set to 1000 ppm to 10000 ppm (1000 ppm in the embodiment).

The second layer 442 positioned closest to the surface layer side has a contained amount of boron set to 10000 to 50000 ppm (10000 ppm in the embodiment). The contained amounts of boron contained in the plurality of those second layers 442 are set so as to gradually increase toward the surface layer side from the base material 30 side (that is, the second layer 442 of the diamond coating 440 positioned on the surface layer side has a contained amount of boron more than the second layer 342 of the diamond coating 440 positioned on the base material 30 side has).

Five layers that form a lower layer portion on the base material 30 side (five layers counted from base material 30 side) among the plurality of diamond coatings 440 have film thicknesses of the first layers 441 and the second layers 442 each set to 0.8 µm. Five layers that form an intermediate layer portion (sixth layer to tenth layer counted from base material 30 side) have film thicknesses of the first layers 441 and the second layers 442 each set to 0.6 µm. Five layers that form an upper layer portion on the surface layer side (eleventh layer to fifteenth layer counted from base material 30 side) among the plurality of diamond coatings 440 have film thicknesses of the first layers 441 and the second layers 442 each set to 0.4 µm.

That is, the first layers 441 and the second layers 442 of the plurality of diamond coatings 440 are formed to have a configuration where the film thicknesses get thinner gradually toward the surface layer side from the base material 30 side. This ensures an increased count of layers of the first layers 441 and the second layers 442 per unit volume on the surface layer side, thereby ensuring improved toughness of the diamond coating 440 on the surface layer side.

Furthermore, since the second layer 442 on the base material 30 side has a small contained amount of boron compared with that on the surface layer side, decreasing a count of the first layers 441 and the second layers 442 per unit volume on the base material 30 side (setting film thickness to thick) ensures the increased compressive stress on the base material 30 side. This ensures the reduced crack generation from the base material 30 side, thereby ensuring improved adhesion of the diamond coating 440 to the base material 30. Accordingly, durability of the tool 401 is improved.

Next, with reference to FIG. 3(*b*), a fifth embodiment will be described. In the fourth embodiment, the case where the plurality of diamond coatings 440 include the respective first layers 441 and second layers 442 has been described. In the fifth embodiment, a description will be given of a case where a third layer 543 is formed in a diamond coating 540 positioned closest to the base material 30 side. Parts identical to those of the above-described fourth embodiment are attached by identical reference numerals to omit their explanations.

FIG. 3(*b*) is a partially enlarged cross-sectional view of a tool 501 according to the fifth embodiment. As illustrated in FIG. 3(*b*), the diamond coating 540 positioned closest to the base material 30 side includes the third layer 543 between the base material 30 and the second layer 442.

This third layer 543 is formed as a layer containing less than 1000 ppm of the boron (regarded as containing no boron), and its film thickness is set to 5 to 15 µm (5 µm in the embodiment). This forms the third layer 543, which is regarded as containing no boron, between the diamond coating 540 and the base material 30, and thus, a compressive stress on the base material 30 side of the diamond coating 540 can be increased. Accordingly, the crack generation from the base material 30 side is reduced to ensure improved adhesion of the diamond coating 540 to the base material 30, thereby improving durability of the tool 501.

Next, with reference to FIG. 4, a description will be given of verification tests performed using the tools 1, 201, 301, and 401 according to the above-described first to fourth embodiments. FIG. 4 is a table showing the test results of the verification tests.

In the verification tests, an oxidation resistance test, a friction coefficient test, a cutting durability test, and an adhesion test were performed using the tools 1, 201, 301, and 401 (hereinafter referred to as "present inventions A, B, C, and D," respectively) according to the first, second, third, and fourth embodiments, a tool that has a surface of the base material 30 on which a diamond coating having a contained amount of boron set to 10000 ppm is formed (hereinafter referred to as "conventional product A"), and a tool that has a surface of the base material 30 on which a diamond coating having a contained amount of boron set to less than 1000 ppm (containing no boron) is formed (hereinafter referred to as "conventional product B").

The oxidation resistance test is a test to measure decrease rates (%) of diamond coating weights of the conventional products A and B, and the present inventions A, B, C, and D after leaving them under an oxidation atmosphere at 600° C. for one hour, and decrease rates (%) of diamond coating weights of the conventional products A and B, and the present inventions A, B, C, and D after leaving them under an oxidation atmosphere at 700° C. for 10 minutes.

The friction coefficient test is a test that forms coatings identical to the diamond coatings formed on the respective conventional products A and B, and present inventions A, B, C, and D on pins having a material identical to that of the base material 30 to measure friction coefficients of the coatings formed on the pins with a pin-on-disk test apparatus. Detailed specifications of this friction coefficient test are, pin (curvature radius of distal end curved surface brought into contact with mating material): R5, disk (mating material): ADC12, linear velocity: 20 m/min, and indentation load: 100 gf.

The cutting durability test is a test that performs cutting work of a workpiece using the conventional products A and B, and the present inventions A, B, C. and D to measure cutting lengths (m) until processing is no longer possible (diamond coating peels off and base material exposes). Detailed specifications of this cutting durability test are, workpiece: carbon-fiber reinforced plastic (CFPR), cutting method: side cutting (up cutting), cutting oil: not used (dry cutting), used machine: vertical machining center, rotation speed: 4000 rotations/min, feed speed: 1524/min, cutting depth: 11.5 mm, and cutting width: 5 mm. In FIG. 4, average values of performing the cutting durability test twice are shown.

The adhesion test is a test that projects a grinding material to the conventional products A and B, and the present inventions A, B, C, and D to measure a period (second) until the diamond coatings peel off. Detailed specifications of this adhesion test are, grinding material: SiC #120, and projection pressure: 5 kgf/cm$^2$.

As illustrated in FIG. 4, in the cutting durability test, the conventional product A that had the surface layer on which the layer containing 10000 ppm of the boron was formed had its diamond coating peeled off at the point when cutting proceeded by 2.5 m. The conventional product B that had the surface layer on which the layer regarded as containing no boron was formed had its diamond coating peeled off at the point when cutting proceeded by 4.5 m. The conventional product A is considered due to the surface layer of the diamond coating had a low compressive stress, and thus, a crack was generated from the surface layer side at an early stage. The conventional product B is considered due to the surface layer of the diamond coating had an excessively high compressive stress, and thus, the surface layer buckled at an early stage.

In contrast to this, the present inventions A, B, C, and D could cut 12.5 m or more. This is considered that the first layers 41, 341, and 441, which contain less than 1000 ppm of the boron (regarded as containing no boron), being laminated on the second layers 42, 242, 342, and 442, which contain the boron, improved the wear resistance on the surface layer side of the diamond coatings 40, 240, 340, and 440 by the first layers 41, 341, and 141 to, while the second layers 42, 242, 342, and 442 ensuring the oxidation resistance and the lubricity, and thus, the crack generation from the surface layer side was reduced.

In particular, the present inventions B, C, and D were in a state where cutting could be continued with no peeling of the diamond coatings 240, 340, and 440 after 42 m of cuttings have finished. Furthermore, the present inventions B, C, and D were confirmed to present the oxidation resistance and the friction coefficient equal to those of the conventional product A having the surface layer on which the layer containing 10000 ppm of the boron is formed.

While the present inventions B, C, and D were confirmed that any of them could cut 42 m or more in the cutting durability tests, in the adhesion tests, with respect to the period until the diamond coating 240 of the present invention B peeled off was 85 seconds, 178 seconds for the diamond coating 340 of the present invention C and 325 seconds for the diamond coating 440 of the present invention D. Accordingly, it has been confirmed that the present invention C has durability higher than that of the present invention B, and yet, the present invention D has durability higher than that of the present invention C. The results of the verification tests of these present inventions A, B, C, and D are considered due to the above-described advantageous effects of the invention.

While the present invention has been described based on the embodiments, the present invention is not at all limited to the above-described embodiments, and it can be easily inferred that various kinds of modifications and changes are allowed within a range not departing from the gist of the present invention.

For example, the numerical values in each of the above-described embodiments are one example, and thus, it is obviously allowed to employ other numerical values. In particular, for values specified by a value range with specific lower limit and upper limit, any value can be employed as long as the value falls within the value range.

While the case where the contained amounts of boron in the first layer and the second layer gradually increase toward the surface layer side and the case where the film thickness gradually decreases toward the surface layer side have been described, it is obviously allowed to change the part that gradually increases to gradually decreasing and to change the part gradually decreases to gradually increasing. A configuration where a contained amount of boron and a film thickness continuously change between the respective layers may be employed or a configuration where a contained amount of boron and a film thickness intermittently change between the respective layers may be employed.

While in each of the above-described embodiments, the end mill has been described as one example of the tool, it is not necessarily limited this. For example, the present invention may be applied to another cutting tool and a burnishing tool (for example, tool bit, milling cutter, drill, reamer, tap, hob, pinion cutter, die, broach, and throwaway tip).

While in each of the above-described embodiments, the case where the tools 1, 201, 301, 401, and 501 are formed of cemented carbide has been described, it is not necessarily limited to this. For example, the tools 1, 201, 301, 401, and 501 may be formed of cermet.

While in the above-described third to fifth embodiments, it has been described the case where the first layers 341 and 441 and the second layers 342 and 442 have the film thicknesses each set to the identical dimension, it is not necessarily limited to this. The film thickness of the first layers 341 and 441 is preferred to be set to a dimension having less than 100% with respect to the dimension of the film thickness of the second layers 342 and 442. This ensures reducing excessive increase of the compressive stress of the first layers 341 and 441. This ensures reduced buckling of the diamond coatings 340 and 440 at processing, thereby improving the durability of the tools 301, 401, and 501.

In this case, it is more preferred to set the film thicknesses of the first layers 341 and 441 to a dimension having 25% or more with respect to the film thicknesses of the second layers 342 and 442. This ensures the improved toughness of the whole plurality of diamond coatings 340 and 440 while reducing the crack generation from the first layers 341 and 441 of the diamond coatings 340 and 440 positioned closest to the surface layer side, thereby improving the durability of the tools 301, 401, and 501.

In the above-described fourth embodiment, it has been described the case where the film thicknesses of the five layers forming the lower layer portion of the base material 30 side among the plurality of diamond coatings 440 are each set to 0.8 µm, the film thicknesses of the five layers forming the intermediate layer portion are each set to 0.6 µm, and the film thicknesses of the five layers forming the upper layer portion are each set to 0.4 µm for the film thicknesses of the first layers 441 and the second layers 442. That is, while the case where the film thicknesses intermittently decrease in each layer toward the surface layer side from the base material 30 side has been described, a configuration where the film thickness continuously decrease in each layer may be employed.

While in the above-described fifth embodiment, the case where the third layer 543 is formed in the diamond coating 540 positioned closest to the base material 30 side has been described, it is not necessarily limited to this. For example, a layer having a configuration identical to that of the third layer 543 may be formed between the diamond coatings 40, 240, and 340 (diamond coatings 240 and 340 positioned closest to base material 30 side) in first to third embodiments and the base material 30. Also in this case, the crack generation from the base material 30 side can be reduced, thereby ensuring the improved adhesion of the diamond coatings 40, 240, and 340 to the base material 30.

The invention claimed is:

1. A tool comprising:
   a base material;
   diamond coatings laminated from a base material side of the tool to a surface layer side of the tool, each diamond coating comprising a first layer of diamond containing no boron and a second layer of diamond containing at least 1000 ppm of boron;
   wherein the diamond coatings comprise a first set of diamond coatings having same thicknesses, a second set of diamond coatings having same thicknesses and a third set of diamond coatings having same thicknesses, laminated from the base material side of the tool to the surface layer side of the tool, wherein a boron concentration in the second layer of the diamond coating in the third set of diamond coatings on the surface layer side of the tool is greater than a boron concentration in the second layer of the diamond coating in the first set of diamond coatings on the base material,
   wherein a thickness of the first layer of diamond in the first set of diamond coatings is greater than a thickness of the first layer of diamond in the second set of diamond coatings, and a thickness of the first layer of diamond in the second set of diamond coatings is greater than a thickness of the first layer of diamond in the third set of diamond coatings, and
   wherein a thickness of the second layer of diamond in the first set of diamond coatings is greater than a thickness of the second layer of diamond in the second set of diamond coatings, and a thickness of the second layer of diamond in the second set of diamond coatings is greater than a thickness of the second layer of diamond in the third set of diamond coatings.

2. The tool according to claim 1,
   wherein the first layer of diamond in the first set of diamond coatings has a film thickness 10% to 50% of a combined film thickness of the first layer of diamond and the second layer of diamond in the first set of diamond coatings.

3. The tool according to claim 1,
   wherein the diamond coating of the first set of diamond coatings positioned closest to the base material includes a third layer containing no boron.

4. The tool according to claim 1,
   wherein a film thickness of the first layer of diamond is less than 100% of a film thickness of the second layer of diamond in each diamond coating.

5. The tool according to claim 4,
   wherein the film thickness of the first layer of diamond is 25% or more of the film thickness of the second layer of diamond in each diamond coating.

* * * * *